United States Patent
Kao et al.

(10) Patent No.: US 9,293,502 B2
(45) Date of Patent: Mar. 22, 2016

(54) SEMICONDUCTOR SWITCHING DEVICE SEPARATED BY DEVICE ISOLATION

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Tzu-Hsuan Hsu, Kaohsiung (TW); Szu-Ying Chen, Toufen Township (TW); Wei-Cheng Hsu, Kaohsiung (TW); Hsiao-Hui Tseng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 101 days.

(21) Appl. No.: 13/951,626

(22) Filed: Jul. 26, 2013

(65) Prior Publication Data

US 2015/0028403 A1   Jan. 29, 2015

(51) Int. Cl.
*H01L 21/00* (2006.01)
*H01L 27/146* (2006.01)
*H01L 31/18* (2006.01)

(52) U.S. Cl.
CPC ...... *H01L 27/14643* (2013.01); *H01L 27/1463* (2013.01); *H01L 27/14685* (2013.01); *H01L 31/18* (2013.01)

(58) Field of Classification Search
CPC .................................................. H01L 27/1463
USPC ............................................................ 438/48
See application file for complete search history.

(56) References Cited

U.S. PATENT DOCUMENTS

| | | | |
|---|---|---|---|
| 2004/0056301 A1* | 3/2004 | Ahmed et al. | 257/327 |
| 2006/0286756 A1* | 12/2006 | Chen | 438/299 |
| 2010/0108864 A1* | 5/2010 | Ohta et al. | 250/214.1 |

\* cited by examiner

*Primary Examiner* — Ajay K Arora
(74) *Attorney, Agent, or Firm* — Haynes and Boone, LLP

(57) ABSTRACT

A device including a gate structure formed over a semiconductor substrate, the gate structure having extensions, a device isolation structure formed into the semiconductor substrate adjacent the gate structure, wherein the extensions are over a portion of the device isolation structure, and source/drain regions on both sides of the gate structure, the source/drain regions being formed in a gap in the device isolation structure and being partially enclosed by the extensions of the gate structure.

20 Claims, 5 Drawing Sheets

SEMICONDUCTOR SWITCHING DEVICE SEPARATED BY DEVICE ISOLATION

BACKGROUND

Photo-sensitive devices are used in a variety of electronic devices. For example, an array of photo-sensitive devices can be used to form an image sensor array to be used in a digital camera. A photo-sensitive device typically includes an active region within a semiconductor material that transfers energy from photons into electrical energy.

Each cell within a photo-sensitive device array includes the main photo-sensitive device as well as some circuit components such as transistors and resistors that are used to measure the electric current produced by the photo-sensitive device. It is important that these circuit components are isolated from the photo-sensitive region because stray electric current can cause dark currents within the photo-sensitive region. This adversely affects the light intensity measurements performed by the photo-sensitive region.

One way to isolate the device structures is to use shallow trench isolation. Shallow trench isolation is a common technique used in semiconductor fabrication and involves the formation of a shallow trench that is then filled with a dielectric material. This technique, however, involves plasma etching which can damage the surface of the substrate. This can adversely affect the performance of the photo-sensitive array.

Another method of isolation is a technique referred to as device isolation. This technique involves the formation of a doped semiconductor material instead of a dielectric material. The doped semiconductor material is of a different concentration than the doping concentration of adjacent semiconductor materials, thus forming a junction. However, this technique is less effective when isolating source/drain regions from photo-sensitive devices. Thus, it is desirable to find a method of isolation that effectively protects the photo-sensitive devices without causing damage to the surface of the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
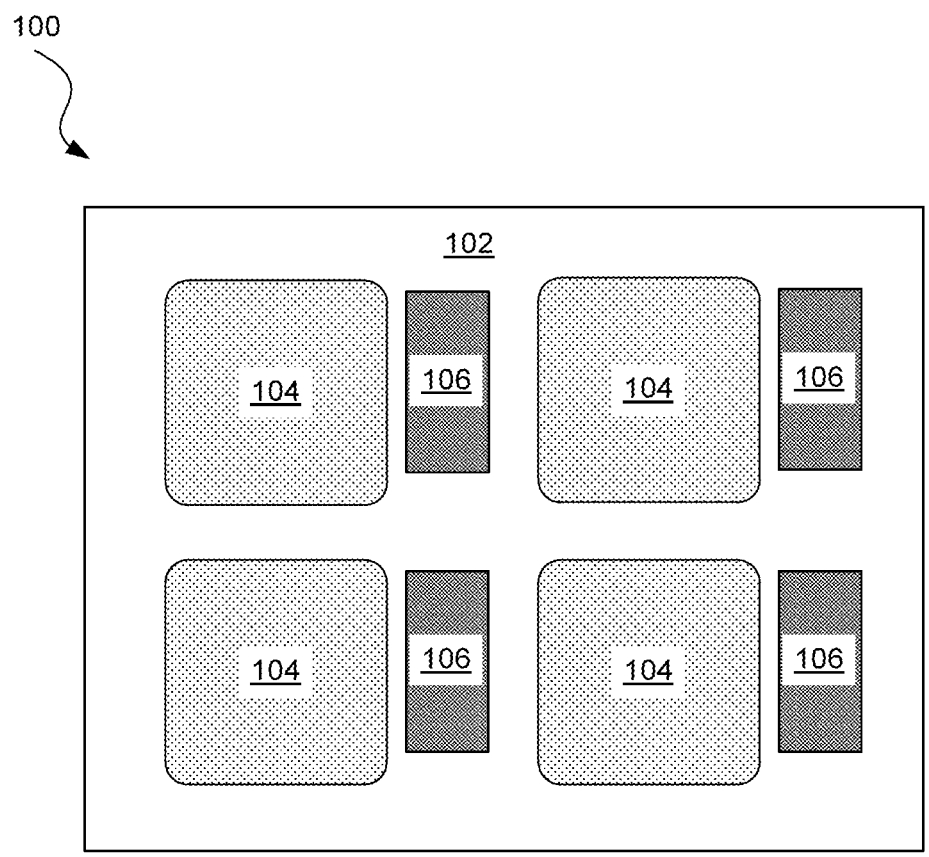
FIG. 1 is a diagram showing an illustrative top view of an array of photo-sensitive devices, according to one example of principles described herein.

FIG. 1 is a diagram showing an illustrative top view of an array 100 of photo-sensitive devices. According to the present example, the photo-sensitive array 100 includes a number of photo-sensitive devices such as photodiodes. Each photo-sensitive device 104 is associated with a set of circuitry 106.

Photodiodes 104 are commonly used in image sensor arrays to measure the intensity of light. Photodiodes 104 are often formed through use of a P-I-N junction. Such a junction includes an intrinsic semiconductor region between a p-type doped region and an n-type doped region. During operations, a reverse bias is typically applied to the photodiode 104. A reverse bias is where the p-type doped region is connected to a negative terminal and a positive terminal is connected to the n-type region. Under such conditions, the photodiode 104 can be used to create either an electric current or a voltage. The strength of the electric current or voltage is based on the intensity of light impinging on the active region of the photodiode 104.

To appropriately bias the photodiode 104 and measure any electric current or voltage being created by the photodiode in response to impinging photons, circuitry 106 is formed onto the substrate 102 adjacent to each photodiode 104. The circuitry includes a variety of components including resistors and switching devices such as Metal Oxide Semiconductor Field Effect Transistors (MOSFETs). Specifically, the circuitry may include a reset transistor, a transfer transistor, a source follower transistor, and a row select transistor. Such switching devices also allow for addressing a specific photodiode 104 within the array 100.

The electric current flowing through the switches and other circuitry 106 associated with each photodiode 104 can cause issues if that current leaks into the active region of the photodiode 104. Thus, it is important that the circuitry 106 is effectively isolated from the active region of the photodiode 104. Isolation is done through use of a device isolation structure. Thus, a device isolation structure may refer to either a doped region or a Shallow Trench Isolation (STI) structure. An STI is the formation of a dielectric material into the semiconductor substrate adjacent to the circuitry to be isolated.

Another isolation technique is referred to as device isolation. Device isolation works by doping a semiconductor substrate to define a device rather than etching a trench and forming a dielectric material in that trench. The doped region effectively creates a junction with the bulk substrate material and prevents electrons from straying through. When forming the source/drain regions of the transistors within the circuitry 106, the ion implantation doping process can result in leakage through the device isolation structure. This can have an adverse effect on a nearby photodiode 104. Specifically it may cause dark current and white pixel effects which will create errors in the measurement of light impinging on the photodiode 104.

FIGS. 2A-2D are diagrams showing top and side views of a process for forming a transistor structure separated from photo-sensitive devices by device isolation. The left side of each figure illustrates a top view 202. The right side of each figure illustrates a cross-sectional view 204. The precise cross-section that is viewed is illustrated by the dotted line 220 shown with the top view 202.

Figure 2A:
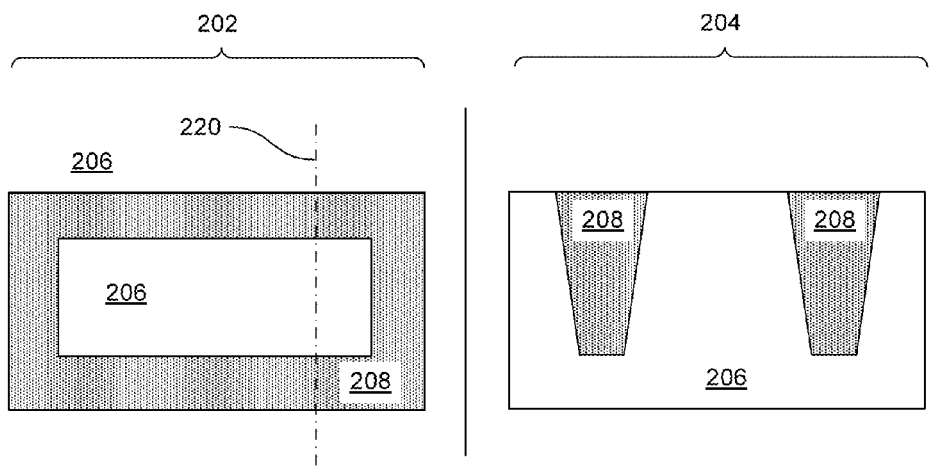
FIGS. 2A-2D are diagrams showing top and side views of a process for forming a transistor structure separated from photo-sensitive devices by device isolation, according to one example of principles described herein.

FIG. 2A illustrates the formation of the device isolation structure 208 into the substrate 206. The substrate 206 may be made of a semiconductor material such as silicon. In some cases, the device isolation structure 208 may exist everywhere except for where components are to be formed. For example, the device isolation structure 208 may be formed everywhere except for where the photodiodes are placed and the circuitry associated with those photodiodes. Thus, the transistor is formed over a gap in the device isolation structure 208.

As mentioned above, device isolation involves a doping of the semiconductor substrate 206. In some cases, the substrate 206 itself may be doped in a particular manner. In such cases, the device isolation structure may have the same type of doping but have a much higher concentration of doping in order to create the junction. Various different device isolation techniques may be used in accordance with principles described herein.

The center portion of the top view illustrates a region where a transistor is to be formed. Thus, the rectangular region of substrate 206 shown in the top view 202 corresponds to where the transistor will be placed. In the cross-sectional view 204, the middle region between the two illustrated device isolation structures 208 corresponds to where the transistor will be placed.

Figure 2B:
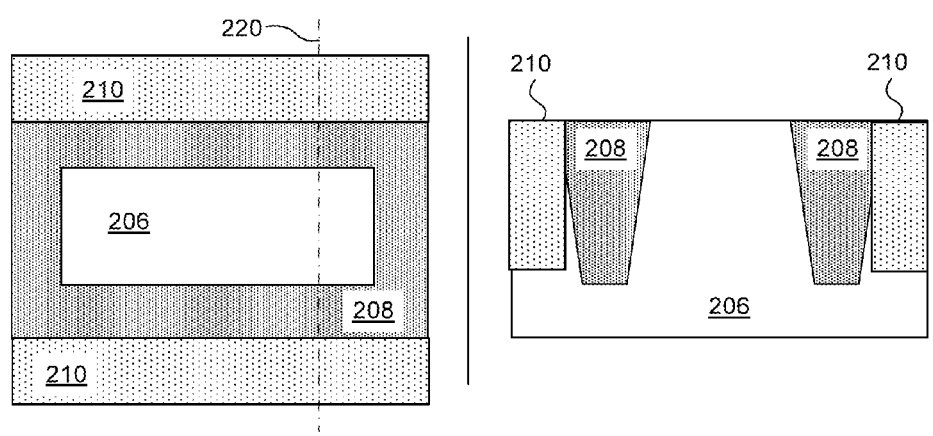

FIG. 2B is a diagram showing the illustrative formation of photodiodes adjacent to the region where the transistor is to be placed. The transistor may be associated with circuitry that is for only one of the photodiodes 210. It is typically desirable to have an array with the photodiodes 210 as close to each other as possible in order to obtain a high resolution image. Thus, the circuitry for each photodiode 210 is often formed directly between two adjacent photodiodes 210.

Figure 2C:
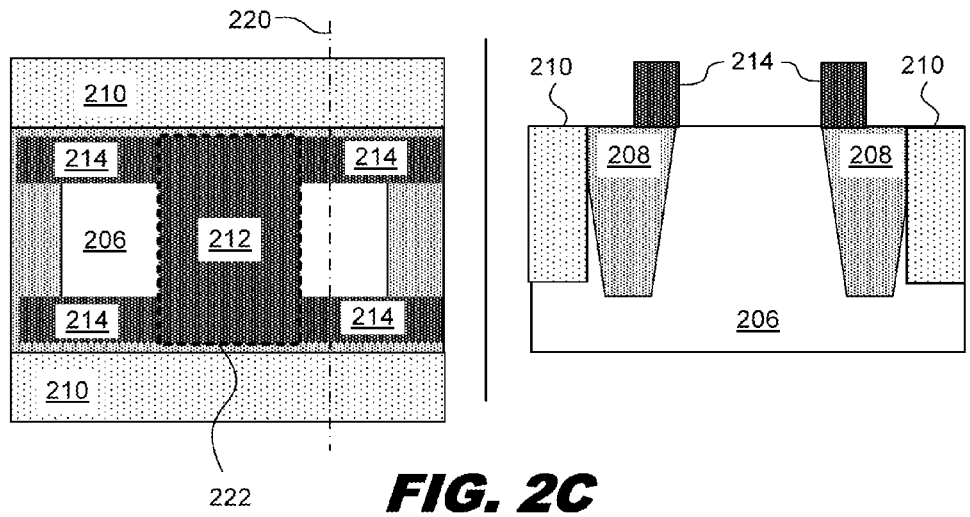

FIG. 2C illustrates the formation of a gate structure 212. Transistors typically include three terminals: a gate terminal, a source terminal, and a drain terminal. The gate terminal is a conductive material. The source and drain terminals are typically doped semiconductor terminals formed at opposing ends of the gate structure. A transistor works by either allowing or blocking current to flow between the source terminal and the drain terminal. Depending on the type of transistor, either a high or low signal will put the transistor into an ON state, where electric current can flow between the source and drain terminal. Conversely, an opposing signal applied at the gate will put the transistor into an OFF state, where electric current is prevented from flowing between the source terminal and the drain terminal.

The top view 202 illustrates a standard gate structure as defined by the dotted square 222. A standard gate structure is typically rectangular from a top perspective. Source and drain regions are typically formed on the opposite long sides of the rectangular gate structure.

According to the present example, the gate structure 212 includes a number of extensions such that the gate structure forms an I-shape. The extensions partially enclose the regions where the source/drain terminals are to be formed. These extensions help block the ion implantation doping process used for form the source/drain regions so that the device isolation structure is not adversely affected. Specifically, without the extensions 214 to block the ion implantation doping process, the source/drain regions may extend too far into the device isolation structure. This would make it more likely that electric current would stray into the active region of the photodiode and cause adverse effects such as dark current and white pixel effects.

The gate structure 212, including the extensions 214, may be made of polysilicon. Polysilicon is a type of silicon that can conduct electric current and is thus suitable for a gate structure 212. As will be described in further detail below, other gate structures of different shapes may also be used to partially enclose the regions where the source/drain regions are to be formed.

The cross-sectional view 204 illustrates the two extensions 214 on one side of the gate structure 212. As illustrated, the extensions 214 may be placed above the device isolation structures 204. The thickness of the extensions 214 may be based on design purposes. Specifically, the thickness of the extensions 214 may be such that the source/drain regions to be formed are effectively confined within the intended area and do no extend into the device isolation structure 208 or otherwise adversely affect the operation of the photodiodes 210.

Figure 2D:
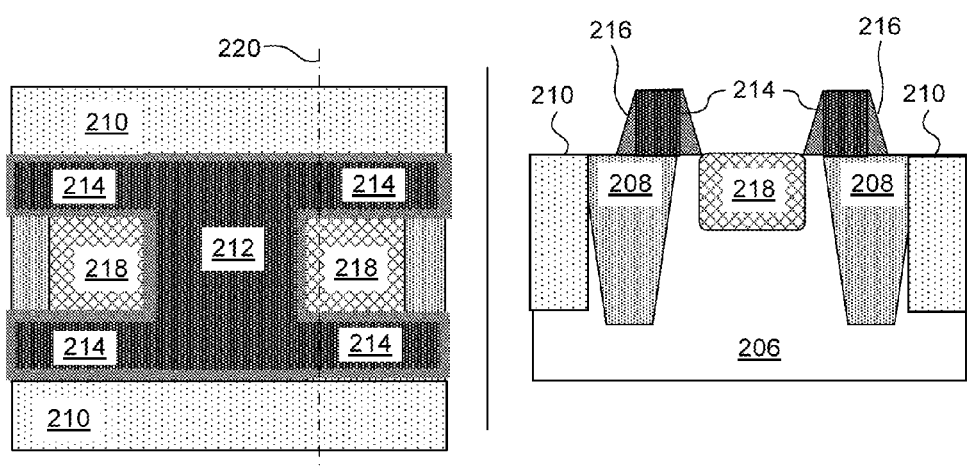

FIG. 2D is a diagram illustrating the formation of sidewall spacers 216 on the gate structure 212 and formation of the source/drain regions 218. Sidewall spacers 216 may be made of a variety of materials including silicon oxide or silicon nitride. Sidewall spacers 216 are commonly used in semiconductor fabrication processes. Sidewall spacers 216 are used to give some space between the gate structure 212 and the formation of a doped source/drain region.

After the sidewall spacers 216 have been formed, the ion implantation doping process can occur. This forms the source/drain regions 218 on both sides of the main portion of the gate structure 212. Because the extensions 214 are present, the formation of the source/drain regions 218 is limited to a specific area. While ion implantation is a relatively controlled process, it is not completely precise. Thus, by blocking the area encompassing the source/drain regions with extensions 214 of the gate structure, the risk of performing the ion implantation process in an undesired location is reduced. The source/drain regions are blocked from being formed too far into the device isolation structures 208.

The cross-sectional view 204 illustrates the formation of one of the source/drain regions 218 between the two extensions 214. As illustrated, the sidewall spacer 216 displaces the source/drain region 218 from being directly adjacent to the extensions 214 of the gate structure 212. Thus, the source/drain regions 218 are also formed within the gap in the device isolation structures 208.

In some cases, a lightly doped region, which is often referred to as LDD, can be formed before sidewall spacers 216 are put into place. For example, to form a p-type source/drain region 218, a p-type LDD doping process occurs before the sidewall spacers are formed. This LDD doping process has a relatively light concentration of dopants. After the sidewall spacers have been formed, the main doping process occurs. The main doping process involves a much higher concentration of p-type dopants than the LDD process.

The top view 202 illustrates the formation of the source/drain regions 218 on both sides of the main gate structure 212 and within the extensions 214. Because the extensions 214 partially encompass the region where the source/drain regions 218 are formed, they limit the formation of the source/drain regions 218 by blocking the ion implantation doping process. This prevents the source/drain regions 218 from being larger than intended and extending into the device isolation structures 208.

Moreover, the source/drain regions 218 are not fully enclosed by the gate structure. Thus, various circuit elements may connect to the source/drain regions 218 through a metal line. For example, a metal line may be routed from either source/drain region 218 to another circuit element such as another transistor or a resistor. Thus, more flexibility in the circuit design is available.

Figure 3:
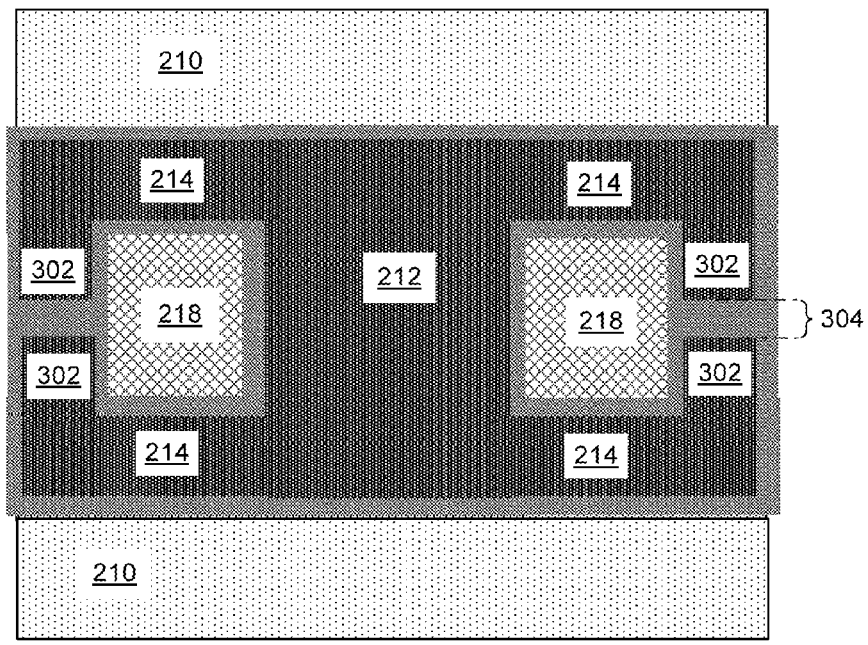
FIG. 3 is a diagram showing further extensions of an I-shaped gate structure, according to one example of principles described herein.

FIG. 3 is a diagram showing further extensions of an I-shaped gate structure. According to the present example, the extensions 214 of the gate structure 212 include further extensions 302. The further extensions 302 are such that the source/drain regions 218 are fully enclosed except for a small gap 304. Thus, the formation of the source/drain regions 218 is further limited. This can help reduce the chances that electric current flowing through the source/drain regions 218 will leak into the photodiodes 210.

The gap 304 may be one of a variety of thicknesses. In one example, the thickness of the gap 204 is twice the thickness of the sidewall spacers 216. Thus, the sidewall spacers 216 will effectively fill in the gap 304 and the source/drain regions 218 will be completely encompassed and thus the ion implantation doping process will be further limited. In some examples, the gap 304 may be only wide enough to allow a metal line to be routed between the further extensions 302 and connect with the source/drain region 218.

Figure 4:
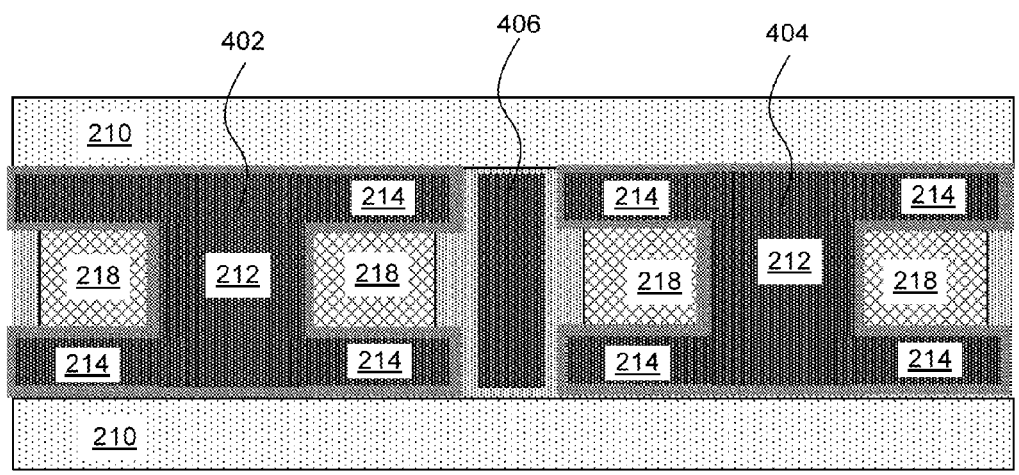
FIG. 4 is a diagram showing an illustrative dummy gate structure, according to one example of principles described herein.

FIG. 4 is a diagram showing an illustrative dummy gate structure. In some cases, multiple transistors 402, 404 may be formed between two photodiodes 210. In such cases, dummy gate structures may be placed between the gate structures 212 of each transistor 402, 404. Specifically, the dummy gate structure may be placed between a first transistor 402 and a second transistor 404. Both transistors 402, 404 may have I-shaped gate structures 212 as illustrated. In some cases, the gate structures 212 may have different shapes that partially enclose the source/drain regions 218.

The dummy gate structure 406 may also be made of polysilicon. The dummy gate structure 406 may be made with the same mask that is used for form the other gate structure 212 and extensions 214. In some examples, the dummy gate structure 406 may be biased. The biasing of the dummy gate may help with the operation of the device isolation structures 208.

Figure 5:
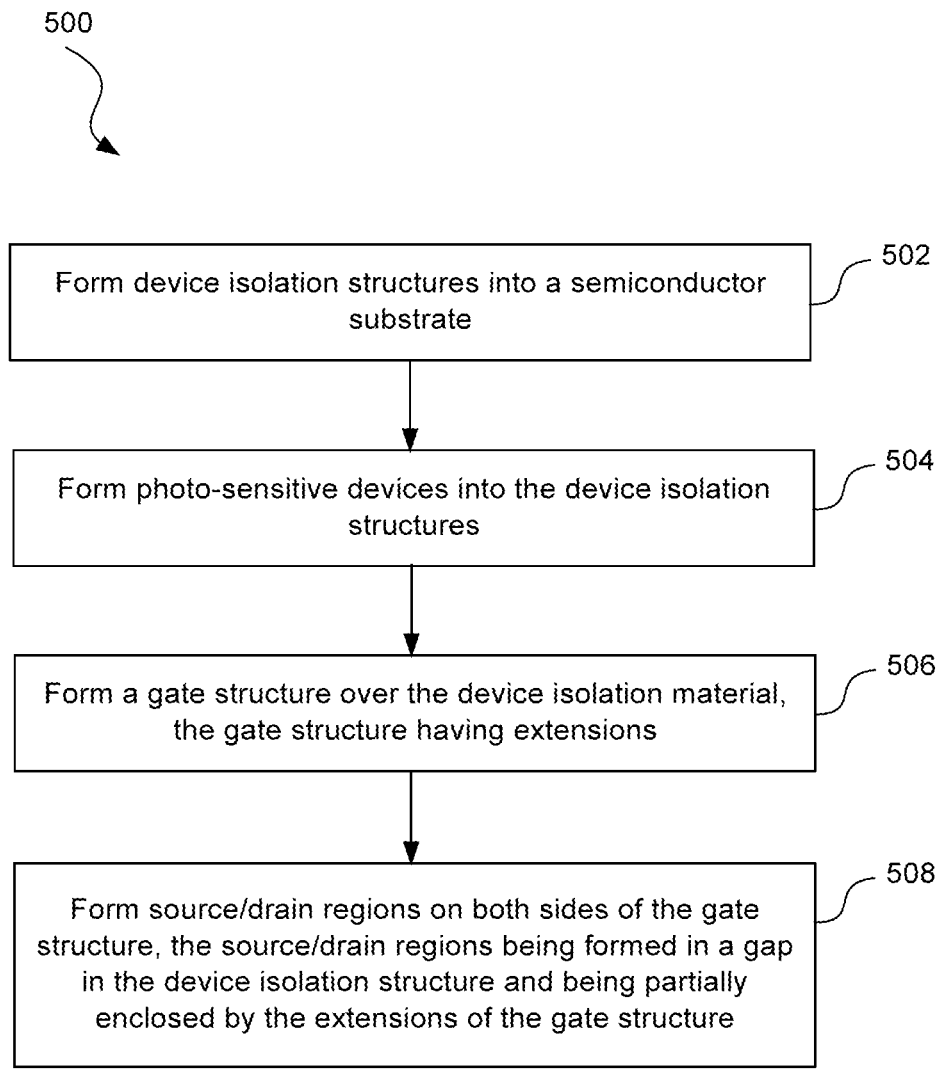
FIG. 5 is a flowchart showing an illustrative method for forming a transistor structure separated by device isolation, according to one example of principles described herein.

FIG. 5 is a flowchart showing an illustrative method for forming a transistor structure separated by device forming 502 device isolation structures into a semiconductor substrate. The method further includes a step for forming 504 photo-sensitive devices into the device isolation structures. The method further includes a step for forming 506 a gate structure over the device isolation material, the gate structure having extensions. The method further includes a step for 508 forming source/drain regions on both sides of the gate structure, the source/drain regions being formed in a gap in the device isolation structure and being partially enclosed by the extensions of the gate structure.

According to certain illustrative examples, a device including a gate structure formed over a semiconductor substrate, the gate structure having extensions, a device isolation structure formed into the semiconductor substrate adjacent the gate structure, wherein the extensions are over a portion of the device isolation structure, and source/drain regions on both sides of the gate structure, the source/drain regions being formed in a gap in the device isolation structure and being partially enclosed by the extensions of the gate structure.

According to certain illustrative examples, a method for forming a transistor device to be used in association with a photo-sensitive device includes forming device isolation structures into a semiconductor substrate, forming photo-sensitive devices into the device isolation structures, forming a gate structure over the device isolation material, the gate structure having extensions over a portion of the device isolation structure, and forming source/drain regions on both sides of the gate structure, the source/drain regions being formed in a gap in the device isolation structure and being partially enclosed by the extensions of the gate structure.

According to certain illustrative examples, a transistor device within an array of photo-sensitive devices includes a device isolation structure formed into a semiconductor substrate, photo-sensitive devices being isolated by the device isolation structure, a gate structure formed over the semiconductor substrate, the gate structure having extensions over a portion of the device isolation structure, a sidewall spacer formed on the sides of the gate structure, and source/drain regions on both sides of the gate structure, the source/drain regions being formed in a gap in the device isolation structure and being partially enclosed by the extensions of the gate structure.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a transistor device to be used in association with a photo-sensitive device, the method comprising:

forming device isolation structure into a semiconductor substrate;

forming photo-sensitive device into the semiconductor substrate;

forming a gate structure over the device isolation structure, the gate structure having extensions over a portion of the device isolation structure; and forming a first source/drain feature on a first side of the gate structure, the first source/drain feature being formed in a gap in the device isolation structure and being partially enclosed by the extensions of the gate structure, wherein the extensions of the gate structure include a first extension enclosing a first edge of the first source/drain feature and a second extension enclosing a second edge of the first source/drain feature.

2. The method of claim 1, further comprising, forming a sidewall spacer on the walls of the gate structure and gate extensions before forming the source/drain regions.

3. The method of claim 1, further comprising, forming a separate dummy gate structure that is positioned perpendicular to the extensions.

4. The method of claim 1, wherein the first edge of the first source/drain feature directly opposes the second edge of the first source/drain feature.

5. The method of claim 1, further comprising forming a second source/drain feature on a second side of the gate structure, wherein the second side of the gate structure is opposite the first side of the gate structure.

6. The method of claim 1, wherein the photo-sensitive device includes a doped region in the substrate.

7. The method of claim 6, wherein the doped region physically contacts the device isolation structure.

8. A method comprising:

forming a dielectric isolation feature in a semiconductor substrate;

forming a photo-sensitive device in the semiconductor substrate adjacent the dielectric isolation feature;

forming a gate structure over the substrate, wherein the gate structure includes:

a first extension portion extending over the semiconductor substrate to the dielectric isolation feature; and a second extension portion extending over the semiconductor substrate to the dielectric isolation feature; and forming a source/drain feature in a source/drain region of the semiconductor substrate, wherein in a top view of the source/drain region the first extension portion extends along a first edge of the source/drain region, the second extension portion extends along a second edge of the source/drain region, and a portion of the dielectric isolation feature extends along a third edge of the source/drain region.

9. The method of claim 8, wherein the second edge of the source/drain region directly opposes the first edge of the source/drain region.

10. The method of claim 8, wherein the portion of the dielectric isolation feature extends from the first extension to the second extension.

11. The method of claim 8, wherein the gate structure includes a third extension interfacing within the first extension, wherein the third extension extends along the third edge of the source/drain region.

12. The method of claim 11, wherein the gate structure includes a fourth extension interfacing within the second extension, wherein the fourth extension extends along the third edge of the source/drain region toward the third extension.

13. The method of claim 12, wherein the third extension is separated away from the fourth extension by a gap that extends between the third and fourth extensions.

14. The method of claim 13, further comprising forming a dielectric material in the gap prior to forming the source/drain feature in the source/drain region of the semiconductor substrate.

15. A method comprising:

forming a dielectric isolation feature in a semiconductor substrate;

forming a photo-sensitive device in the semiconductor substrate adjacent the dielectric isolation feature;

after forming a photo-sensitive device in the semiconductor substrate, forming a gate structure over the substrate, wherein the gate structure includes:

a first portion extending over the semiconductor substrate in a first direction;

a second portion spaced apart from the first portion and extending over the semiconductor substrate in the first direction; and a third portion extending in a second direction from the first portion to the second portion;

forming a source/drain feature in a region of the semiconductor substrate, wherein the region of the substrate is bounded by the first, second and third portions of the gate structure.

16. The method of claim 15, wherein the first portion has a first width in the first direction and the third portion has a second width in the first direction that is less than the first width.

17. The method of claim 15, wherein the first, second, and third portions form an I-shape in a top view of the gate structure.

18. The method of claim 15, wherein the first, second, and third portions include a polysilicon material.

19. The method of claim 15, wherein at least some of the first portion is formed directly over the dielectric isolation structure.

20. The method of claim 15, wherein a portion of the dielectric isolation structure extends from the first portion to the second portion such that the region of the substrate is bounded by the first, second and third portions of the gate structure and the portion of the dielectric isolation structure.

* * * * *